US010011770B2

(12) United States Patent
Kurosawa et al.

(10) Patent No.: US 10,011,770 B2
(45) Date of Patent: Jul. 3, 2018

(54) CRYSTAL MATERIAL, METHOD FOR MANUFACTURING CRYSTAL, RADIATION DETECTOR, NONDESTRUCTIVE INSPECTION APPARATUS, AND IMAGING APPARATUS

(71) Applicants: TOHOKU UNIVERSITY, Sendai-shi, Miyagi (JP); C&A CORPORATION, Sendai-shi, Miyagi (JP)

(72) Inventors: Shunsuke Kurosawa, Sendai (JP); Akira Yoshikawa, Sendai (JP); Kei Kamada, Sendai (JP); Yuui Yokota, Sendai (JP); Yuji Ohashi, Sendai (JP); Takahiko Horiai, Sendai (JP); Yasuhiro Shoji, Sendai (JP); Rikito Murakami, Sendai (JP)

(73) Assignees: TOHOKU UNIVERSITY, Miyagi (JP); C&A CORPORATION, Miyagi (JP)

( * ) Notice: Subject to any disclaimer, the term of this patent is extended or adjusted under 35 U.S.C. 154(b) by 0 days.

(21) Appl. No.: 15/566,199

(22) PCT Filed: May 27, 2016

(86) PCT No.: PCT/JP2016/065837
§ 371 (c)(1),
(2) Date: Oct. 12, 2017

(87) PCT Pub. No.: WO2016/190439
PCT Pub. Date: Dec. 1, 2016

(65) Prior Publication Data
US 2018/0100101 A1    Apr. 12, 2018

(30) Foreign Application Priority Data

May 27, 2015 (JP) .................. 2015-107986

(51) Int. Cl.
*C30B 15/00* (2006.01)
*C09K 11/77* (2006.01)
(Continued)

(52) U.S. Cl.
CPC ...... *C09K 11/7774* (2013.01); *C01F 17/0043* (2013.01); *C30B 15/00* (2013.01);
(Continued)

(58) Field of Classification Search
CPC ............. C09K 11/7774; C09K 11/772; C09K 11/7733; C09K 11/7748; C09K 11/7705;
(Continued)

(56) References Cited

U.S. PATENT DOCUMENTS 7,122,129 B2  10/2006  Yagi et al.
2003/0188637 A1*  10/2003  Ito .................... B01D 53/22
96/108

(Continued)

FOREIGN PATENT DOCUMENTS

JP   2009-074039 A    4/2009
WO  2003/083010 A1   10/2003
(Continued)

OTHER PUBLICATIONS

S. Kawamura et al., "Floating zone growth and scintillation characteristics of cerium-doped gadolinium pyrosilicate single crystals," IEEE Nuclear Science Symposium Conference Record, San Diego, USA, pp. 1160-1163 (Oct. 29-Nov. 5, 2006).
(Continued)

*Primary Examiner* — David Porta
*Assistant Examiner* — Faye Boosalis
(74) *Attorney, Agent, or Firm* — McDermott Will & Emery LLP

(57) ABSTRACT

A crystal material that is represented by a general formula (1): $(RE_xA_{1-x-y-s}B_yM'_s)_{2+\alpha}(Si_{1-t}M''_t)_{2+\beta}O_{7+\gamma}$ (1), the crystal
(Continued)

material having a pyrochlore type structure, being a nonstoichiometric composition, and being a congruent melting composition, wherein in Formula (1), A contains at least one or more selected from Gd, Y, La, Sc, Yb, and Lu; B contains at least one or more selected from La, Gd, Yb, Lu, Y, and Sc; $0.1 \leq y < 0.4$; RE contains at least one or more selected from Ce, Pr, Nd, Eu, Tb, and Yb; $0 < x < 0.1$; M' and M" contain at least one or more selected from Li, Na, K, Mg, Ca, Sr, Ba, Ti, Zr, Hf, Fe, Ta, and W; $0 \leq s < 0.01$ and $0 \leq t < 0.01$; and $0 < |\alpha| < 0.3$ and $0 \leq |\beta| < 0.3$ and $0 \leq |\gamma| < 0.5$.

17 Claims, 7 Drawing Sheets

(51) Int. Cl.
  *H01L 27/146* (2006.01)
  *C01F 17/00* (2006.01)
  *G01T 1/20* (2006.01)
  *C30B 29/22* (2006.01)
  *G01T 1/202* (2006.01)

(52) U.S. Cl.
  CPC .......... *C30B 29/22* (2013.01); *G01T 1/2006* (2013.01); *G01T 1/2023* (2013.01); *H01L 27/14663* (2013.01)

(58) Field of Classification Search
  CPC ..... C09K 11/628; C09K 11/616; C30B 15/00; C30B 29/22; C30B 29/12; G01T 1/2002; G01T 1/2023; G01T 1/202; H01L 27/14663

See application file for complete search history.

(56) References Cited

U.S. PATENT DOCUMENTS

| | | |
|---|---|---|
| 2014/0061537 A1 | 3/2014 | Zagumennyi et al. |
| 2015/0346360 A1 | 12/2015 | Yoshikawa et al. |

FOREIGN PATENT DOCUMENTS

| | | |
|---|---|---|
| WO | 2013/152434 A2 | 10/2013 |
| WO | 2014/104238 A1 | 7/2014 |
| WO | 2015/037726 A1 | 3/2015 |

OTHER PUBLICATIONS

S. Kawamura et al., "Phase Relations around the Pyrosilicate Phase in the Gd2O3—Ce2O3—SiO2 System," Crystal Growth & Design, vol. 9, No. 3, pp. 1470-1473 (2009).

A. Suzuki et al., "Fast and High-Energy-Resolution Oxide Scintillator: Ce-Doped (La,Gd)2Si2O7", Applied Physics Express, vol. 5, p. 102601-1 to 102601-3 (2012).

Search Report issued in corresponding International Patent Application No. PCT/JP2016/065837, dated Jul. 26, 2016.

\* cited by examiner

CRYSTAL MATERIAL, METHOD FOR MANUFACTURING CRYSTAL, RADIATION DETECTOR, NONDESTRUCTIVE INSPECTION APPARATUS, AND IMAGING APPARATUS

CROSS REFERENCE

This application is the U.S. National Phase under 35 U.S.C. § 371 of International Application No. PCT/JP2016/065837, filed on May 27, 2016, which claims the benefit of Japanese Application No. 2015-107986, filed on May 27, 2015, the entire contents of each are hereby incorporated by reference.

FIELD

The present invention relates to a crystal material, a method for manufacturing a crystal, a radiation detector, a nondestructive inspection apparatus, and an imaging apparatus.

BACKGROUND

Scintillator single crystals are used for radiation detectors that detect gamma rays, X rays, alpha rays, neutron rays, or the like. Such radiation detectors are widely used for medical imaging apparatuses (imaging apparatuses) such as positron emission tomography (PET) apparatuses and X-ray CT apparatuses, various radiation measuring apparatuses in the field of high-energy physics, resource exploration apparatuses (resource exploration such as oil well logging), or the like.

A radiation detector generally includes a scintillator that absorbs gamma rays, X rays, alpha rays, or neutron rays and converts the rays into scintillation light and a photodetector such as a light-receiving element that receives the scintillation light and converts the scintillation light into an electric signal or the like. In high-energy physics or positron emission tomographic (PET) imaging systems, for example, images are created based on interaction between the scintillator and radiation generated through radioactive decay. In positron emission tomographic (PET) imaging systems, gamma rays generated through interaction between positrons and corresponding electrons within a subject enter the scintillator and are converted into photons, which can be detected by a photodetector. The photons emitted from the scintillator can be detected using photodiodes (PDs), silicon photomultipliers (Si-PMs), photomultiplier tubes (PMTs), or other photodetectors.

The PMT has a high quantum yield (efficiency about converting photons into electrons (a current signal)) in the wavelength range of about 400 nm and is used in combination with a scintillator having a peak emission wavelength of mainly about 400 nm. For a scintillator array, in which scintillators are arranged in an array, a position sensitive PMT (PS-PMT) or the like is used in combination. With this configuration, it can be determined which pixel of the scintillator array has detected a photon from gravity computation.

Semiconductor photodetectors such as photodiodes (PDs), avalanche photodiodes (APDs), and silicon photomultipliers (Si-PMs) have wide applications in radiation detectors and imaging devices in particular. Various semiconductor photodetectors are known. PDs and Si-PMs formed of silicon semiconductors, for example, have a quantum efficiency of 50% or more in the wavelength band from 350 nm to 900 nm and have higher quantum efficiency than PMTs, the quantum efficiency of which is 45% at most. In the above wavelength band, the sensitivity is higher in the wavelength band from 500 nm to 700 nm and peaks at around 600 nm, in which the quantum efficiency is about 80%. Given these circumstances, these semiconductor photodetectors are used in combination with scintillators having a peak emission wavelength in the range from 350 nm to 900 nm, centering at around 600 nm. Similarly to PMTs, also for PDs, APDs, and Si-PMs, there exist PD arrays having position detection sensitivity, position sensitive avalanche photodiodes (PSAPDs), and Si-PM arrays. These elements can also determine which pixel of the scintillator array has detected a photon. Furthermore, even for short-wavelength light emission scintillators of 350 nm or less, scintillation light is converted into light with a wavelength range in which silicon semiconductors have sensitivity by, for example, using Si-PMs for short wavelength or wavelength conversion elements, thereby achieving radiation detectors that perform reading by silicon semiconductors.

The scintillator adapted for these radiation detectors is desired to have high density and a large atomic number (a high photoelectric absorption ratio) in view of detection efficiency, a large light emission amount in view of high energy resolution, and a short fluorescence lifetime (fluorescence decay time) in view of the necessity of high-speed response. In addition, in recent years' systems, many scintillators are required to be densely arranged in a long, narrow shape (about 5 mm×30 mm for PET, for example) for the purpose of achieving a multilayered structure and increased resolution, and important selection factors include handleability, processability, capability of producing large crystals, and a price. It is also important that the light emission wavelength of the scintillators matches the wavelength range with high detection sensitivity of the photodetectors.

Examples of scintillators currently suitable for the application to various radiation detectors include a scintillator $Ce:Gd_2Si_2O_7$ having a pyrochlore type structure. The scintillator has the advantages of chemical stability, the absence of deliquescence, and being large in light emission amount. A scintillator having the pyrochlore type structure using light emission from the 4f5d level of $Ce^{3+}$ described in Non Patent Literature 1, for example, has a short fluorescence lifetime of about 80 ns or less and also has a large light emission amount. On the other hand, however, as described in Non Patent Literature 1, the scintillator has the problem that because of being a peritectic composition on the phase diagram, single crystal growth from a melt is impossible, and it is difficult to obtain a large transparent body.

Scintillators having the pyrochlore type structure described in Patent Literature 1 and Patent Literature 2 and Non Patent Literature 2 are attempted to stabilize the structure by substituting Ce for rare-earth-element sites. With this stabilization, this crystal can be produced as a large single crystal by melt growth methods such as the floating zone method, the Czochralski method, the micro pulling-down method, and the Bridgman method. However, increased Ce at the sites of the rare earth element leads to the problem (concentration quenching) that the light emission amount drastically decreases.

Patent Literature 3 and Patent Literature 4 and Non Patent Literature 3 attempt to stabilize the structure by substituting one or more elements selected from Y, Yb, Sc, La, and Lu for the rare-earth-element (especially La) sites. With this stabilization, it was expected that this crystal would be able to be produced as a large single crystal by melt growth methods such as the floating zone method, the Czochralski method, the micro pulling-down method, and the Bridgman method. Although the attempt produces some effects, in $(R,R')_2Si_2O_7$, a stoichiometric composition of $(R+R'):Si:O = 2:2:7$ is not a congruent melting composition, impurities are produced and captured as a heterophase when a bulk single crystal is produced, which causes cracks and defects, and thus the problem that a large-diameter bulk single crystal cannot be obtained with high yield has been newly found.

Furthermore, a nonstoichiometric composition shifts the balance of electric charges, which may cause problems such as the occurrence of strain in the crystal and influence on a fluorescence lifetime.

CITATION LIST

Patent Literature

Patent Literature 1: Japanese Patent Application Laid-open No. 2009-74039
Patent Literature 2: WO 2003/083010
Patent Literature 3: WO 2014/104238
Patent Literature 4: WO 2015/037726
Non Patent Literature 1: S. Kawamura, J. H. Kaneko, M. Higuchi, T. Yamaguchi, J. Haruna, Y. Yagi, K. Susa, F. Fujita, A. Homma, S. Nishiyama, H. Ishibashi, K. Kurashige and M. Furusaka, IEEE Nuclear Science Symposium Conference Record, San Diego, USA, 29 Oct.-5 Nov. 2006, pp. 1160-1163.
Non Patent Literature 2: S. Kawamura, M. Higuchi, J. H. Kaneko, S. Nishiyama, J. Haruna, S. Saeki, S. Ueda, K. Kurashige, H. Ishibashi and M. Furusaka, Crystal Growth & Design, volume 9 (3), 2009, pages 1470-1473.
Non Patent Literature 3: A. Suzuki, S. Kurosawa, T. Shishido, J. Pejchal, Y. Yokota, Y. Futami, A. Yoshikawa, "Fast and High-Energy-Resolution Oxide Scintillator: Ce-Doped $(La,Gd)_2Si_2O_7$", Appl. Phys. Express vol. 5, 2012, page 102601.

SUMMARY

Technical Problem

Scintillators absorb high-energy photons and convert them into low-energy photons; in order to absorb the high-energy photons, a large transparent body is required. Crystals such as $Ce:Gd_2Si_2O_7$ and $Ce:(Gd,La)_2Si_2O_7$ used as scintillators have a large light emission amount, are short in fluorescence lifetime, and exhibit excellent characteristics but have the problem that a bulk body that is high in quality, is transparent, and is high in crystallization rate is difficult to be obtained.

The present invention has been made in view of the foregoing, and an object thereof is to provide a crystal material that is a nonstoichiometric composition with electric charge adjusted, is a congruent melting composition, can provide a high-quality, transparent bulk body, has a large light emission amount, and is short in fluorescence lifetime, a method for manufacturing the same, and a radiation detector, an imaging apparatus, and a nondestructive inspection apparatus containing the crystal material.

Solution to Problem

To solve the problem and achieve the object, there is provided a crystal material represented by a general formula (1): $(RE_xA_{1-x-y-s}B_yM'_s)_{2+\alpha}(Si_{1-t}M''_t)_{2\alpha\beta}O_{7+\gamma}$ (1), the crystal material having a pyrochlore type structure, being a nonstoichiometric composition, and being a congruent melting composition, wherein in Formula (1), A contains at least one or more selected from Gd, Y, La, Sc, Yb, and Lu; B contains at least one or more selected from La, Gd, Yb, Lu, Y, and Sc; $0.1 \leq y < 0.4$; RE contains at least one or more selected from Ce, Pr, Nd, Eu, Tb, and Yb; $0 < x < 0.1$; M' and M'' contain at least one or more selected from Li, Na, K, Mg, Ca, Sr, Ba, Ti, Zr, Hf, Fe, Ta, and W; $0 \leq s < 0.01$ and $0 \leq t < 0.01$; and $0 < |\alpha| < 0.3$ and $0 \leq |\beta| < 0.3$ and $0 \leq |\gamma| < 0.5$. By selecting the nonstoichiometric composition and the congruent melting composition, dramatic improvement in crystallization rate is achieved. In the above, || represents an absolute value; $0 < |\alpha| < 0.3$ means $0 < \alpha < 0.3$ or $0 > \alpha > -0.3$. Similarly, $0 \leq |\beta| < 0.3$ means $0 < \beta < 0.3$ or $0 > \beta > -0.3$ or $\beta = 0$. Similarly, $0 \leq |\gamma| < 0.5$ means $0 < \gamma < 0.5$ or $0 > \gamma > -0.5$ or $\gamma = 0$.

There is provided the crystal material according to the present invention in which the ranges of x, y, s, t, $\alpha$, $\beta$, and $\gamma$ are further represented by $0 < x < 0.05$, $0.1 < y < 0.40$, $0 \leq s < 0.005$, and $0 \leq t < 0.005$, $0.001 < |\alpha| < 0.15$ and $0.001 \leq |\beta| < 0.15$ and $0.001 < |\gamma| < 0.2$.

There is provided the crystal material according to the present invention in which the ranges of x, y, s, t, $\alpha$, $\beta$, and $\gamma$ are further represented by $0 < x < 0.04$, $0.1 < y < 0.35$, $0 \leq s < 0.005$, and $0 \leq t < 0.005$, $0.01 < |\alpha| < 0.1$ and $0.01 \leq |\beta| < 0.1$ and $0.001 \leq |\gamma| < 0.2$.

There is provided the crystal material according to the present invention in which in the general formula (1), RE is Ce; A is Gd; and B is one or more selected from La and Y.

There is provided the crystal material according to the present invention in which the crystal material emits scintillation light through irradiation with radiation, with a certain fluorescent component contained in the scintillation light having a fluorescence lifetime of 2 μs or less and a peak fluorescence wavelength within a range of 250 nm or more and 900 nm or less.

There is provided the crystal material according to the present invention in which the crystal material emits scintillation light through irradiation with radiation, with a certain fluorescent component contained in the scintillation light having a fluorescence lifetime of 80 ns or less and a peak fluorescence wavelength within a range of 300 nm or more and 700 nm or less.

There is provided the crystal material according to the present invention in which the crystal material emits scintillation light through irradiation with radiation, with a light emission amount of a certain fluorescent component contained in the scintillation light exceeding 13,000 photons/MeV in an environmental temperature range from room temperature to 150° C. and the crystal material does not have deliquescence.

There is provided a method for manufacturing a crystal including: blending raw materials containing A, Si, and RE so as to provide an element ratio of the crystal material according to the present invention, increasing a temperature of the blended raw materials until the blended raw materials melt and then cooling the raw materials, and providing a crystal having a pyrochlore type structure and a crystallization rate of 50% or more.

There is provided a radiation detector including: a scintillator formed of the crystal material according to the present invention; and a photodetector that receives scintillation light from the scintillator.

There is provided a radiation detector including: a scintillator formed of the crystal material according to the present invention; a wavelength conversion element that receives scintillation light from the scintillator and converts a wavelength of light with wavelengths from 260 nm to 350 nm contained in the scintillation light into any wavelength in a range from 320 nm to 700 nm; and a photodetector that receives light wavelength-converted by the wavelength conversion element.

There is provided a radiation detector including the scintillator formed of the crystal material according to the present invention having positional sensitivity.

There is provided an imaging apparatus including the radiation detector according to the present invention.

There is provided a nondestructive inspection apparatus including the radiation detector according to the present invention.

Advantageous Effects of Invention

The present invention produces an effect of making it possible to markedly reduce time and costs required for growth compared with existing pyrochlore type structure crystals with a stoichiometric composition while the crystal with the congruent melting composition maintains excellent characteristics including having a large light emission amount and being short in fluorescence lifetime.

DESCRIPTION OF EMBODIMENTS

Figure 1:
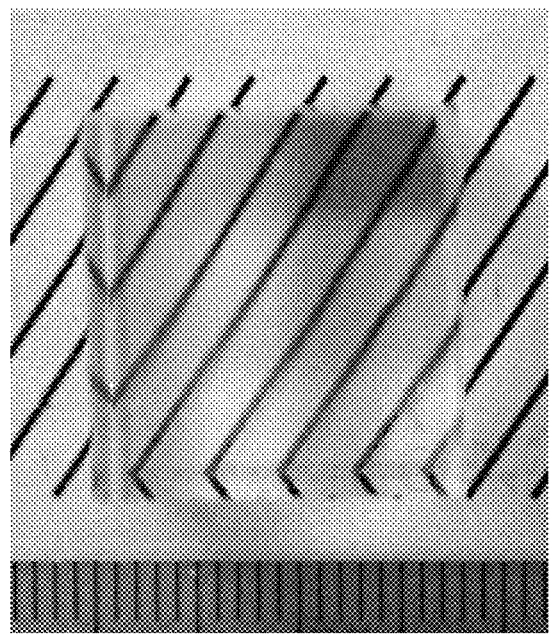
FIG. 1 is a photograph of a produced $(Ce_{0.015}Gd_{0.750}La_{0.235})_{1.95}Si_{2.01}O_{6.94}$ crystal and a photograph of a cut and polished section of this crystal.

The following describes embodiments of a crystal material, a method for manufacturing a crystal, a radiation detector, an imaging apparatus, and a nondestructive inspection apparatus according to the present invention in detail with reference to the accompanying drawings. The present invention is not limited by the embodiments.

The crystal material according to the embodiment of the present invention is a crystal material that is represented by a general formula (1):

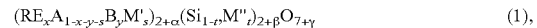

$$(RE_xA_{1-x-y-s}B_yM'_s)_{2+\alpha}(Si_{1-t}M''_t)_{2+\beta}O_{7+\gamma} \qquad (1),$$

has a pyrochlore type structure, is a nonstoichiometric composition, and is a congruent melting composition.

In Formula (1), A contains at least one or more selected from Gd, Y, La, Sc, Yb, and Lu; B contains at least one or more selected from La, Gd, Yb, Lu, Y, and Sc; 0.1<y<0.4; RE contains at least one or more selected from Ce, Pr, Nd, Eu, Tb, and Yb; 0<x<0.1; M' and M'' contain at least one or more selected from Li, Na, K, Mg, Ca, Sr, Ba, Ti, Zr, Hf, Fe, Ta, and W; 0≤s<0.01 and 0≤t<0.01; and 0<|α|<0.3 and 0≤|β|<0.3 and 0≤|γ|<0.5. As to RE, apart from rare earth elements, transition metals can also be selected as a light emission activator. The combination of the ranges of x, y, s, t, α, β, and γ is defined as Composition Range (1).

Preferably, the ranges of x, y, s, t, α, β, and γ in Formula (1) are further represented by 0<x<0.05, 0.1<y<0.40, 0≤s<0.005, and 0≤t<0.005, 0.001<|α|<0.15 and 0.001≤|β|<0.15 and 0.001≤|γ|<0.2. The combination of the ranges of x, y, s, t, α, β, and γ is defined as Composition Range (2).

More preferably, the ranges of x, y, s, t, α, β, and γ in Formula (1) are further represented by 0<x<0.04, 0.1<y<0.35, 0≤s<0.005, and 0≤t<0.005, 0.01<|α|<0.1 and 0.01≤|β|<0.1 and 0.001≤|γ|<0.2. The combination of the ranges of x, y, s, t, α, β, and γ is defined as Composition Range (3).

With these compositions, the crystal material according to the present embodiment is a crystal material that has a large light emission amount of scintillation light produced through irradiation with radiation and a short fluorescence lifetime. In the general formula (1), RE is preferably Ce, A is preferably Gd, and B is preferably one or more selected from La and Y, for example.

Although pyrosilicate crystals having a known pyrochlore type structure are expected to have a large light emission amount, the stoichiometric composition is not the congruent melting composition, leading to the problem that it is extremely difficult to produce transparent bulk bodies and a yield or a crystallization rate (a non-defective product rate of produced crystals) becomes worse during crystal production. In contrast, the crystal material according to the present embodiment can be configured to solve these problems. As examples, x, y, s, t, α, β, and γ with Composition Range (1) can obtain a crystallization rate of 55% or more, those with Composition Range (2) can obtain a crystallization rate of 60% or more, and those with Composition Range (3) can obtain a crystallization rate of 70% or more, for example.

Figure 11:
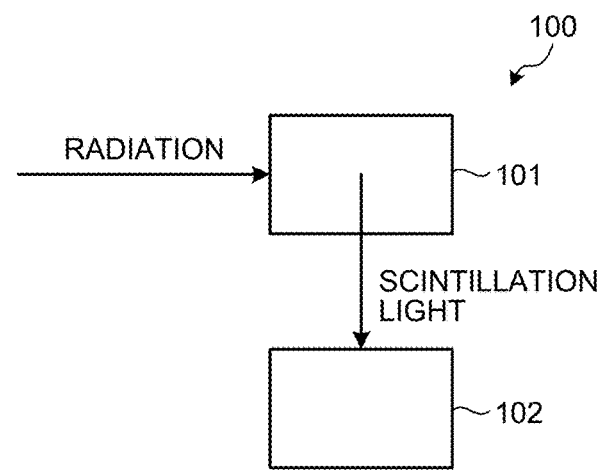
FIG. 11 is a diagram illustrating a radiation detector according to an embodiment of the present invention.
Figure 12:
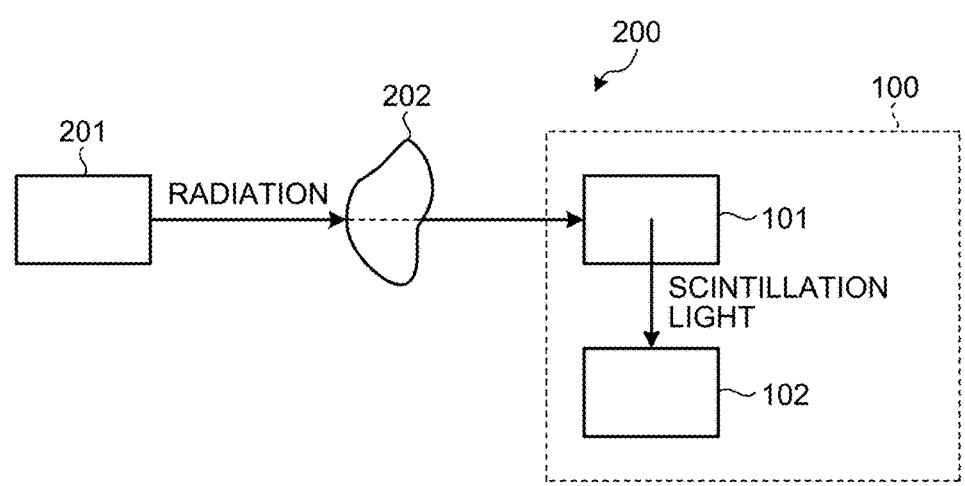
FIG. 12 is a diagram illustrating a nondestructive inspection apparatus according to an embodiment of the present invention.

As illustrated in FIG. 11, for example, the crystal material according to the present embodiment can be used as a radiation detector 100 by being combined with a photodetector 102 that can receive scintillation light generated by a crystal material 101 according to the present embodiment as the crystal material. Furthermore, as illustrated in FIG. 12, for example, the crystal material according to the present embodiment can also be used as a radiation measuring apparatus or a resource exploration apparatus as a nondestructive inspection apparatus 200 including the radiation detector 100 by irradiating an object under measurement 202 with radiation from a radiation source 201 and detecting the radiation having passed through the object under measurement 202 by the radiation detector 100.

Figure 13:
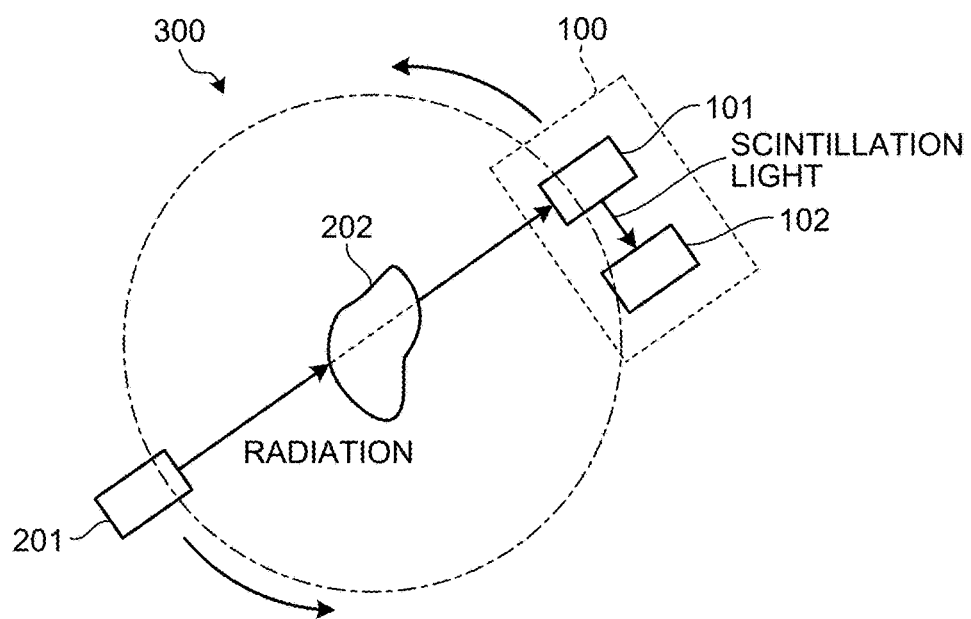
FIG. 13 is a diagram illustrating an imaging apparatus according to an embodiment of the present invention.

In the crystal material according to the present embodiment, the fluorescence lifetime of a fluorescent component contained in the scintillation light can be 10 µs or less, and the peak fluorescence wavelength thereof can be within the range of 150 nm or more and 900 nm or less. Furthermore, the fluorescence lifetime can be 2 µs or less, and the peak fluorescence wavelength thereof can be within the range of 250 nm or more and 900 nm or less. The fluorescence lifetime is thus short, and only a short sampling time for fluorescence measurement is required, and high time resolution, that is, a sampling interval can be reduced. The achievement of the high time resolution can increase a sampling number per unit time. The crystal material having such short-lifetime emission can be suitably used as a scintillator for radiation detection with high-speed response for PET, single photon emission computed tomography (SPECT), and CT as imaging apparatuses. As illustrated in FIG. 13, for example, the radiation source 201 and the radiation detector 100 are arranged at symmetrical points on the circumference of a circle, and tomographic images of the object under measurement 202 are acquired while scanning the circumference, thereby enabling use as an imaging apparatus 300 using CT.

Figure 14:
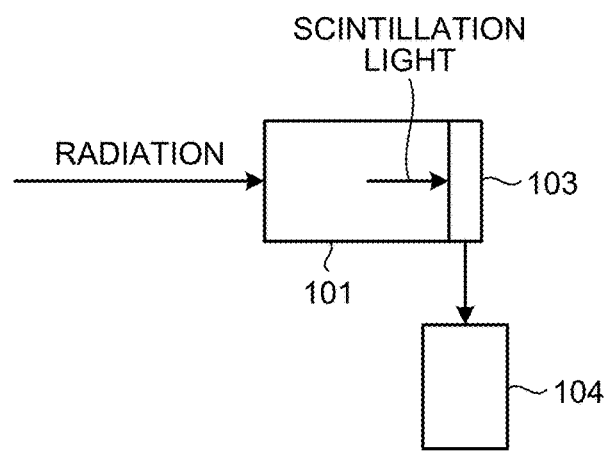
FIG. 14 is a diagram illustrating a radiation detector according to an embodiment of the present invention.

The peak fluorescence wavelength of the fluorescent component is within the range of 150 nm or more and 900 nm or less. Therefore, the peak fluorescence wavelength can be detected through combination with semiconductor photodetectors such as PDs, APDs, and Si-PMs formed of silicon semiconductors. When the peak fluorescence wavelength of the fluorescent component is 250 nm or more and 400 nm or less in particular, it is effective that the peak fluorescence wavelength is converted into any wavelength of 300 nm or more and 900 nm or less, that is, any wavelength within the range in which the above photodetectors have sufficient wavelength sensitivity using a wavelength conversion element. Examples of the wavelength conversion element include one that converts a wavelength of light with wavelengths from 260 nm to 350 nm contained in the scintillation light into any wavelength in the range from 320 nm to 700 nm. As illustrated in FIG. 14, for example, by using a plastic optical fiber for wavelength conversion (Y11(200)M-S manufactured by Kuraray, Co., Ltd., for example) or the like as a wavelength conversion element 103, scintillation light emitted by the crystal material 101 can be wavelength-converted and then be received by a photodetector 104. The type of the photodetector to be combined can be appropriately used in accordance with the peak fluorescence wavelength or the like; PMTs or PS-PMTs may be used, for example.

In the crystal material according to the present embodiment, when the fluorescence lifetime of the fluorescent component contained in the scintillation light is 80 ns or less, and the peak fluorescence wavelength thereof is within the range of 300 nm or more and 700 nm or less, the detection of the scintillation light with higher resolution and higher sensitivity can be achieved. When the fluorescence lifetime is 60 ns or less, and the peak fluorescence wavelength thereof is within the range of 320 nm or more and 700 nm or less, the detection of the scintillation light with even higher resolution and even higher sensitivity is achieved, which is thus preferred. The adjustment of the fluorescence lifetime and the peak fluorescence wavelength can be achieved by the adjustment of the composition of the crystal material. When a Ce concentration is increased, for example, the fluorescence lifetime shortens. Through the addition of a minute amount of elements that can have a valence number of monovalence, divalence, or tetravalence or more, the lifetime may shorten. Examples of the elements that can have a valence number of monovalence, divalence, or tetravalence or more include, but are not limited to, Li, Na, K, Mg, Ca, Sr, Ba, Ti, Zr, Hf, Fe, Ta, and W.

In the crystal material according to the present embodiment, with the light emission amount of the fluorescent component when an environmental temperature is 0° C. as a standard, the light emission amount of the fluorescent component in an environmental temperature range from room temperature to 150° C. can exceed 13,000 photons/MeV, and the attenuation rate thereof from the standard can be less than 50%. Furthermore, the light emission amount of the fluorescent component at room temperature after being left in an environment of 400° C. or more for 12 hours or more does not have fluctuations with 20% or more, has no deliquescence and the like, and is high in mechanical strength. Consequently, the crystal material according to the present embodiment can lessen a reduction in the light emission amount even under a high-temperature environment and is thus extremely useful as a crystal material used under a high-temperature environment or a large-vibration environment.

In particular, a scintillator formed of the crystal material according to the present embodiment and a photodetector that receives the light emitted from the scintillator and operates at an environmental temperature of room temperature or more and 200° C. or less are combined to constitute a radiation detector, whereby the radiation detector can be used without cooling for resource exploration or the like that requires measurement under a high-temperature environment and under a large-vibration environment, which is thus preferred.

The following describes a method for manufacturing a single crystal of the crystal material (a method for manufacturing a crystal) according to the present embodiment. In a method for manufacturing a single crystal of any composition, general oxide raw materials can be used as starting materials; when being used as a signal crystal for scintillator use, high-purity raw materials with 99.99% or more (4N or more) are particularly preferably used. These starting materials containing A, Si, and RE are weighed, mixed, and blended so as to form a target composition (an element ratio according to the present embodiment) when a melt is formed and are used as crystal growth raw materials. Furthermore, these starting materials particularly preferably contain impurities other than the target composition in an amount as small as possible (1 ppm or less, for example).

The compositions of the starting raw materials are, not stoichiometric compositions, desirably prepared considering that the melt has the ratio of the congruent melting composition according to the present embodiment. In that case, losses in a crystal manufacturing process such as ignition loss are desirably considered.

The growth of the crystal is preferably performed in an atmosphere of inert gas (Ar, $N_2$, He, or the like). A mixed gas of the inert gas (Ar, $N_2$, He, or the like) and an oxygen gas may be used. When the growth of the crystal is performed in an atmosphere of the mixed gas, however, the partial pressure of oxygen is preferably 2% or less for the purpose of preventing oxidation of a crucible. When a method of production that does not use any crucible such as the floating zone method is used, however, the partial pressure of oxygen can be set up to 100%. In later processes such as annealing after the crystal growth, the oxygen gas, the inert gas (Ar, $N_2$, He, or the like), and the mixed gas of the inert gas (Ar, $N_2$, He, or the like) and the oxygen gas can be used. In the later processes, when the mixed gas is used, any mixture ratio with an oxygen partial pressure from 0% to 100% may be used without the limitation that the oxygen partial pressure is 2% or less.

Examples of the method for manufacturing a single crystal of the crystal material according to the present embodiment include, but not limited to, various crystal growth methods such as, in addition to the micro-pulling-down method, the Czochralski method (a pulling-up method), the Bridgman method, the zone melt method, the edge-defined film-fed growth (EFG) method, the floating zone method, and the Bernoulli method. To obtain large single crystals, the Czochralski method or the Bridgman method is preferred. By using large single crystals, the yield of the single crystals is increased, and processing loss can be relatively reduced. Consequently, crystal materials with lower costs and higher quality can be obtained than those obtained by such a method that extracts a single crystal from a polycrystallized body as described in Patent Literature 1. However, the crystal material according to the present embodiment is not limited to the single crystal and may be a polycrystalline sintered body such as ceramics.

When only a small single crystal is used as the single crystal for scintillator use, the floating zone method, the zone melt method, the EFG method, the micro pulling-down method, or the Czochralski method is preferred due to the absence of or less necessity of post-processing. The micro pulling-down method or the zone melt method is particularly preferred for the reason of wettability with crucibles or the like.

Examples of materials that can be used for the crucible and an after heater include platinum, iridium, rhodium, rhenium, and alloys of these elements.

In the manufacture of the single crystal for scintillator use, a high-frequency oscillator, a light-concentrating heater, and a resistance heater may further be used.

The following describes methods for manufacturing a single crystal using the micro pulling-down method, the Czochralski method, and the floating zone method as examples of the method for manufacturing a single crystal of the crystal material according to the present embodiment; the method for manufacturing a single crystal of the crystal material according to the present embodiment is not limited to these methods.

The micro pulling-down method can be performed using an atmosphere-controlled micro pulling-down apparatus by known high-frequency induction heating. The micro pulling-down apparatus is an apparatus for manufacturing a single crystal including, for example, a crucible containing a raw melt, a seed-crystal holder that holds a seed crystal to be in contact with the raw melt flowing out of a pore provided in the bottom of the crucible, a moving mechanism that moves the seed-crystal holder downward, a moving-speed controller that controls the speed of the moving mechanism, and an induction heating unit (a high-frequency induction heating coil, for example) that heats the crucible. Such an apparatus for manufacturing a single crystal forms a solid-liquid interface immediately below the crucible and moves the seed crystal downward, thereby producing a single crystal.

In the micro pulling-down apparatus, the crucible is formed of carbon, platinum, iridium, rhodium, rhenium, or an alloy of these elements. The after heater as a heating element formed of carbon, platinum, iridium, rhodium, rhenium, or an alloy of these elements is arranged on the perimeter of the bottom of the crucible. Outputs of the respective induction heating units of the crucible and the after heater are adjusted to adjust a colorific value, thereby controlling the temperature and its distribution of the solid-liquid interface of the raw melt pulled out of the pore provided in the bottom of the crucible.

The atmosphere-controlled micro pulling-down apparatus is an apparatus that uses stainless steel (SUS) for the material of a chamber and quartz for a window material, includes a rotary pump for enabling atmospheric control, and can make the degree of vacuum thereinside $1 \times 10^{-3}$ Torr or less before gas substitution. Ar, $N_2$, $H_2$, $O_2$, or He gas or the like can be introduced into the chamber with its flow precisely controlled by an accompanying gas flow meter; the atmospheric gas species are not limited to these ones.

Using this apparatus, the crystal growth raw materials prepared by the above method are put into the crucible. A furnace is evacuated to be high vacuum, and Ar gas or a mixed gas of Ar gas and $O_2$ gas is introduced into the furnace, thereby making the inside of the furnace an inert gas atmosphere or a low-oxygen-partial-pressure atmosphere. Next, a high-frequency power is gradually applied to the high-frequency induction heating coil to heat the crucible and raise the temperature thereof until the raw materials melt, thereby perfectly melting the raw materials within the crucible.

Subsequently, the seed crystal held by the seed-crystal holder is gradually raised at a certain speed by the moving mechanism. A tip of the seed crystal is brought into contact with the pore at the lower end of the crucible to be sufficiently compatible therewith, and then the seed crystal is lowered to be cooled while adjusting the temperature of the melt, thereby growing a crystal.

Although the seed crystal is preferably equal to an object of crystal growth or close thereto in both structure and composition, the seed crystal is not limited to this example. The seed crystal preferably has clear crystal orientation.

When the prepared crystal growth raw materials are all crystallized, and the melt is exhausted, the crystal growth ends. For the purpose of maintaining the composition of the crystal to be grown to be uniform and for the purpose of increasing length, a device for continuously charging the crystal growth raw materials may be incorporated. With this incorporation, a crystal can be grown while charging the crystal growth raw materials.

The following describes the Czochralski method. The Czochralski method can be performed using an atmosphere-controlled pulling-up apparatus by known high-frequency induction heating. The pulling-up apparatus is a single crystal manufacturing apparatus including, for example, a crucible containing a raw melt, a seed-crystal holder that holds a seed crystal to be in contact with the raw melt, a moving mechanism that moves the seed-crystal holder upward, a moving-speed controller that controls the speed of the moving mechanism, and an induction heating unit (a high-frequency induction heating coil, for example) that heats the crucible. Such a single crystal manufacturing apparatus forms a solid-liquid interface on the upper face of the melt and moves the seed crystal upward, thereby producing a single crystal.

Although the seed crystal is preferably equal to an object of crystal growth or close thereto in both structure and composition, which are not limiting. The seed crystal preferably has clear crystal orientation.

The micro pilling-down method, the Czochralski method, the Bridgman method, and the Bernoulli method can perform crystal growth mainly with the congruent melting composition.

The following describes the floating zone method. The floating zone method is a method that collects light of a halogen lamp or the like by generally two to four rotational ellipsoidal mirrors, places part of a sample rod formed of a polycrystal at their ellipsoidal focus, raises the temperature of the polycrystal by optical energy to melt the polycrystal, moves the melting part by gradually moving the mirrors (focus) while gradually cooling the melted part, thereby changing the sample rod into a large single crystal.

The floating zone method does not use any crucible and thus can grow a crystal with higher purity. Furthermore, a crystal can be grown even under a condition in which crystal growth is difficult owing to oxidation of a crucible in an oxygen atmosphere.

Although the following describes examples and a comparative example of the present invention in detail with reference to the drawings, the invention is not limited thereto. In the following examples, the Ce concentration is described either as a concentration in a specific crystal or as a concentration in a melt (preparation).

Example 1

A crystal represented by a composition of $(Ce_{0.015}Gd_{0.750}La_{0.235})_{1.95}Si_{2.01}O_{6.94}$ was produced by the Czochralski method. This crystal is a pyrochlore type oxide. FIG. 1 is a photograph of a section (a thickness of 15 mm, a face of 15 mm×15 mm, and mirror-polished) of the produced $(Ce_{0.015}Gd_{0.750}La_{0.235})_{1.95}Si_{2.01}O_{6.94}$ crystal. As illustrated in FIG. 1, the produced single crystal, through which the pattern thereunder was seen, was a transparent bulk body.

Example 2

Figure 2:
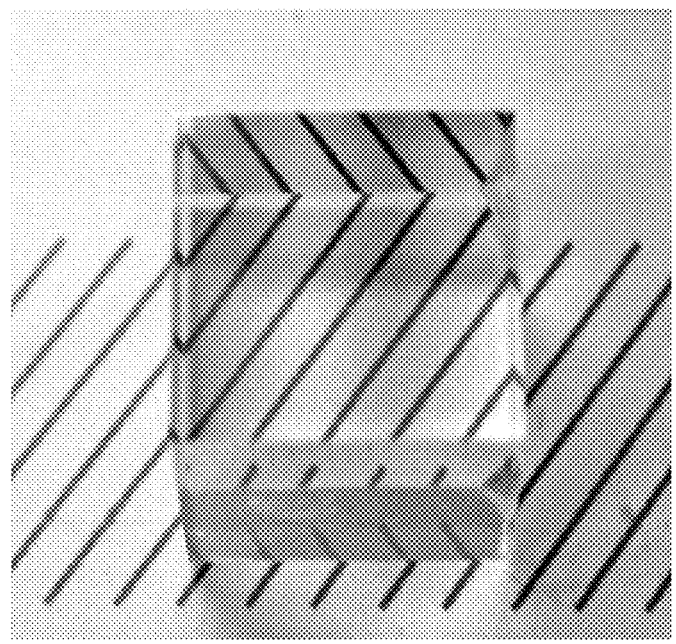
FIG. 2 is a photograph of a produced $(Ce_{0.015}Gd_{0.7499}La_{0.235}Mg_{0.0001})_{1.997}Si_{2.05}O_{7.10}$ crystal and a photograph of a cut and polished section of this crystal.

A crystal represented by a composition of $(Ce_{0.015}Gd_{0.7499}La_{0.235}Mg_{0.0001})_{1.99}Si_{2.05}O_{7.10}$ was produced by the Czochralski method. This crystal is a pyrochlore type oxide. FIG. 2 is a photograph of a section (a thickness of 15 mm, a face of 15 mm×15 mm, and mirror-polished) of the produced $(Ce_{0.015}Gd_{0.7499}La_{0.235}Mg_{0.0001})_{1.99}Si_{2.05}O_{7.10}$ crystal. As illustrated in FIG. 2, the produced single crystal, through which the pattern thereunder was seen, was a transparent bulk body.

Examples 3 to 25

In addition to the above, crystals represented by the respective compositions as listed in Table 1 were produced by the Czochralski method. These crystals are pyrochlore type oxides represented by $A_2B_2O_7$. The produced single crystals, through which the pattern thereunder was seen, were transparent bulk bodies.

Example 21

Figure 3:
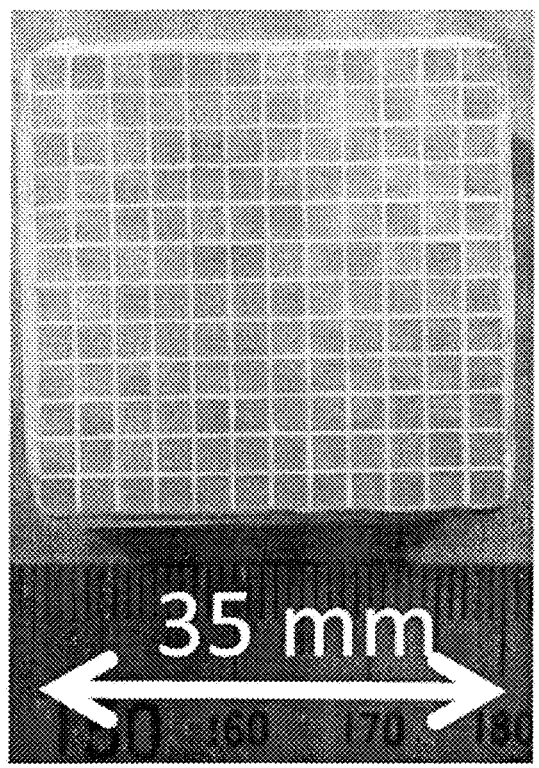
FIG. 3 is a photograph of a pixel array.

FIG. 3 is a photograph of a pixel array formed using the crystal of Example 1. The pixel size is 2.5 mm×2.5 mm×5 mm, and the pixel number is pixel number: 12×12.

Comparative Example 1

Figure 4:
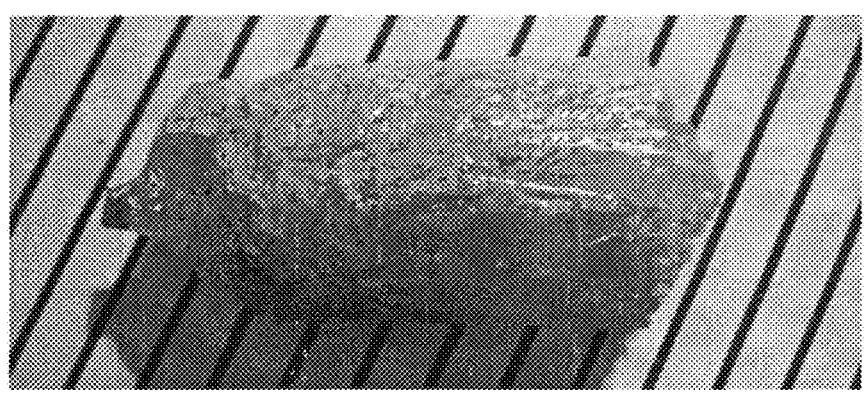
FIG. 4 is a photograph of a produced $(Ce_{0.013}La_{0.132}Gd_{0.855})_{1.66}Si_{2.48}O_{7.02}$ crystal.
Figure 5:
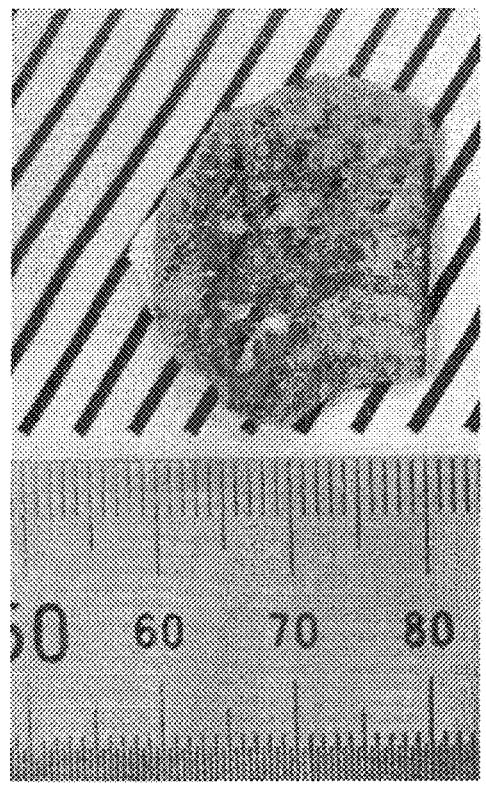
FIG. 5 is a photograph of a cut and polished section of a produced $(Ce_{0.013}La_{0.132}Gd_{0.855})_{1.66}Si_{2.48}O_{7.02}$ crystal.

A crystal represented by a composition $(Ce_{0.013}Gd_{0.855}La_{0.132})_{1.66}Si_{2.48}O_{7.02}$ was produced by the Czochralski method. This crystal is a pyrochlore type oxide represented by $A_2B_2O_7$. FIG. 4 is a photograph of the produced $(Ce_{0.013}Gd_{0.855}La_{0.132})_{1.66}Si_{2.48}O_{7.02}$ crystal. FIG. 5 is a photograph of a section (a thickness of 1 mm and mirror-polished) of the crystal. As illustrated in FIG. 4 and FIG. 5, the produced single crystal was a yellow, opaque bulk body.

Comparative Example 2

Figure 6:
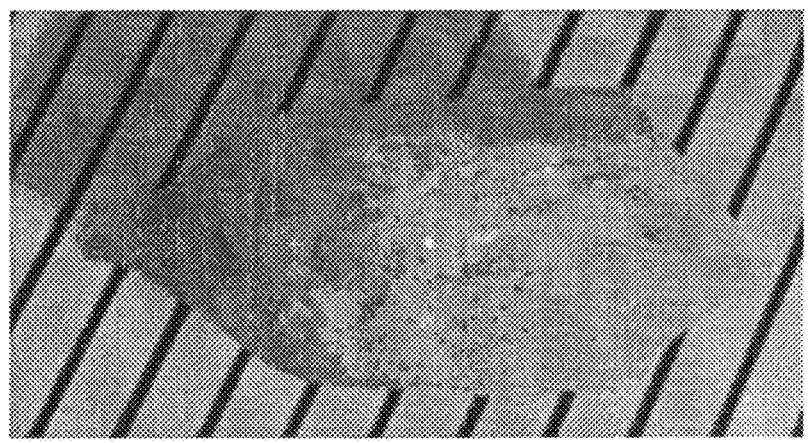
FIG. 6 is a photograph of a cut and polished section of a produced $(Ce_{0.023}Gd_{0.751}La_{0.226})_2Si_2O_7$ crystal.

A crystal represented by a composition $(Ce_{0.023}Gd_{0.751}La_{0.226})_2Si_2O_7$ was produced by the Czochralski method. This crystal is a pyrochlore type oxide represented by $A_2B_2O_7$. FIG. 6 is a photograph of the produced $(Ce_{0.023}Gd_{0.751}La_{0.226})_2Si_2O_7$ crystal. As illustrated in FIG. 6, the produced single crystal was a yellow, opaque bulk body.

Table 1 lists α, β, and γ and the state of the crystal for Examples 1 to 25 and Comparative Examples 1 to 9.

TABLE 1

| Example No. | | α | β | γ | State of crystal | Crystallization rate [%] |
|---|---|---|---|---|---|---|
| Example 1 | $(Ce_{0.015}Gd_{0.750}La_{0.235})_{1.95}Si_{2.01}O_{6.94}$ | −0.05 | 0.01 | −0.06 | A | 70 |
| Example 2 | $(Ce_{0.015}Gd_{0.7499}La_{0.235}Mg_{0.0001})_{1.997}Si_{2.05}O_{7.10}$ | −0.003 | 0.05 | 0.10 | A | 75 |
| Example 3 | $(Ce_{0.015}Gd_{0.7495}La_{0.235}Mg_{0.0005})_{1.99}Si_{2.03}O_{7.05}$ | −0.01 | 0.03 | 0.05 | A | 70 |
| Example 4 | $(Ce_{0.015}Gd_{0.749}La_{0.235}Mg_{0.001})_{1.95}Si_{2.00}O_{7.08}$ | −0.05 | 0.00 | −0.08 | A | 55 |
| Example 5 | $(Ce_{0.015}Gd_{0.7498}La_{0.235}Ca_{0.0002})_{1.98}Si_{2.06}O_{7.09}$ | −0.02 | 0.06 | 0.09 | A | 70 |
| Example 6 | $(Ce_{0.015}Gd_{0.7498}La_{0.235}Sr_{0.0002})_{1.95}Si_{2.04}O_{7.01}$ | −0.05 | 0.04 | 0.01 | A | 70 |
| Example 7 | $(Ce_{0.015}Gd_{0.7499}La_{0.235}Zr_{0.0001})_{1.96}Si_{2.05}O_{7.04}$ | −0.04 | 0.05 | 0.04 | A | 70 |
| Example 8 | $(Ce_{0.015}Gd_{0.7498}La_{0.235}Zr_{0.0002})_{1.96}Si_{2.05}O_{7.04}$ | −0.04 | 0.05 | 0.04 | A | 70 |
| Example 9 | $(Ce_{0.015}Gd_{0.75}La_{0.235})_{1.96}(Si_{0.999}Zr_{0.001})_{2.06}O_{7.02}$ | −0.04 | 0.04 | 0.02 | A | 70 |
| Example 10 | $(Ce_{0.015}Gd_{0.7498}La_{0.235}Hf_{0.0002})_{1.99}Si_{2.03}O_{7.05}$ | −0.01 | 0.03 | 0.05 | A | 70 |
| Example 11 | $(Ce_{0.015}Gd_{0.741}La_{0.235}Sc_{0.009})_{1.88}Si_{2.07}O_{6.98}$ | −0.12 | 0.07 | −0.04 | A | 60 |
| Example 12 | $(Ce_{0.015}Gd_{0.742}La_{0.235}Ti_{0.004}K_{0.004})_{1.93}Si_{2.04}O_{6.97}$ | −0.06 | 0.03 | −0.03 | A | 55 |
| Example 13 | $(Nd_{0.005}Gd_{0.750}La_{0.245})_{1.99}Si_{2.02}O_{7.02}$ | −0.01 | 0.02 | 0.02 | A | 70 |
| Example 14 | $(Ce_{0.015}Gd_{0.735}La_{0.235}Tb_{0.015})_{1.98}Si_{2.02}O_{7.01}$ | −0.02 | 0.02 | 0.01 | A | 70 |
| Example 15 | $(Ce_{0.015}Gd_{0.735}La_{0.235}Fe_{0.005})_{1.93}Si_{2.03}O_{6.98}$ | −0.14 | 0.10 | −0.02 | A | 55 |
| Example 16 | $(Ce_{0.015}Gd_{0.742}La_{0.235}Li_{0.004}Ta_{0.004})_{1.94}Si_{2.03}O_{6.97}$ | −0.06 | 0.03 | −0.03 | A | 55 |
| Example 17 | $(Ce_{0.001}Gd_{0.750}La_{0.249})_{1.97}Si_{2.09}O_{7.14}$ | −0.03 | 0.09 | 0.14 | A | 70 |
| Example 18 | $(Ce_{0.095}Gd_{0.700}La_{0.205})_{1.98}Si_{2.12}O_{7.21}$ | −0.02 | 0.12 | 0.21 | A | 55 |
| Example 19 | $(Ce_{0.010}Gd_{0.600}La_{0.390})_{1.98}Si_{2.06}O_{7.07}$ | −0.02 | 0.05 | 0.07 | A | 60 |
| Example 20 | $(Ce_{0.01}Gd_{0.89}La_{0.10})_{1.98}Si_{2.00}O_{6.97}$ | −0.02 | 0.00 | −0.03 | A | 55 |
| Example 21 | $(Ce_{0.010}Gd_{0.650}La_{0.240}Y_{0.100})_{1.99}Si_{2.08}O_{7.15}$ | −0.01 | 0.08 | 0.15 | A | 75 |
| Example 22 | $(Ce_{0.010}Yb_{0.990})_{1.99}Si_{2.11}O_{6.79}$ | −0.01 | 0.00 | 0.00 | A | 55 |
| Example 23 | $(Ce_{0.010}Lu_{0.890}Gd_{0.100})_{1.94}Si_{2.06}O_{7.01}$ | −0.06 | 0.05 | 0.01 | A | 70 |
| Example 24 | $(Pr_{0.01}Eu_{0.01}Gd_{0.740}La_{0.24})_{1.89}Si_{2.04}O_{6.91}$ | −0.11 | 0.04 | −0.09 | A | 60 |
| Example 25 | $(Ce_{0.015}Gd_{0.742}La_{0.235}W_{0.004}Na_{0.004})_{1.91}Si_{2.01}O_{6.88}$ | −0.09 | 0.01 | −0.12 | A | 55 |
| Comparative Example 1 | $(Ce_{0.013}Gd_{0.855}La_{0.132})_{1.68}Si_{2.48}O_{7.02}$ | −0.34 | 0.48 | 0.02 | B | 0 |

TABLE 1-continued

| Example No. | | α | β | γ | State of crystal | Crystallization rate [%] |
|---|---|---|---|---|---|---|
| Comparative Example 2 | $(Ce_{0.023}Gd_{0.751}La_{0.226})_2Si_2O_7$ | 0 | 0 | 0 | B | 0 |
| Comparative Example 3 | $(Ce_{0.013}Gd_{0.854}La_{0.132}Mg_{0.001})_{1.66}Si_{2.48}O_{7.02}$ | −0.34 | 0.48 | 0.02 | B | 0 |
| Comparative Example 4 | $(Ce_{0.013}Gd_{0.8548}La_{0.132}Ca_{0.0002})_{1.66}Si_{2.48}O_{7.02}$ | −0.34 | 0.48 | 0.02 | B | 0 |
| Comparative Example 5 | $(Ce_{0.013}Gd_{0.8548}La_{0.132}Sr_{0.0002})_{1.66}Si_{2.48}O_{7.02}$ | −0.34 | 0.48 | 0.02 | B | 0 |
| Comparative Example 6 | $(Ce_{0.023}Gd_{0.750}La_{0.226}Mg_{0.001})_2Si_2O_7$ | 0 | 0 | 0 | B | 0 |
| Comparative Example 7 | $(Ce_{0.023}Gd_{0.7508}La_{0.226}Ca_{0.0002})_2Si_2O_7$ | 0 | 0 | 0 | B | 0 |
| Comparative Example 8 | $(Ce_{0.023}Gd_{0.7508}La_{0.226}Sr_{0.0002})_2Si_2O_7$ | 0 | 0 | 0 | B | 0 |
| Comparative Example 9 | $(Ce_{0.007}Gd_{0.726}La_{0.227})_2Si_2O_7$ | 0 | 0 | 0 | A | 5 |

Legends:
A: transparent bulk body,
B: opaque bulk body, and
α, β, and γ are those defined by Formula (1).

Comparative Example 10

A commercially available $(Ce_{0.01}Gd_{0.99})_2SiO_5$ (Ce1%: GSO) crystal with a size of 5 mm×5 mm×5 mm was prepared as known Comparative Example 10.

Figure 7:
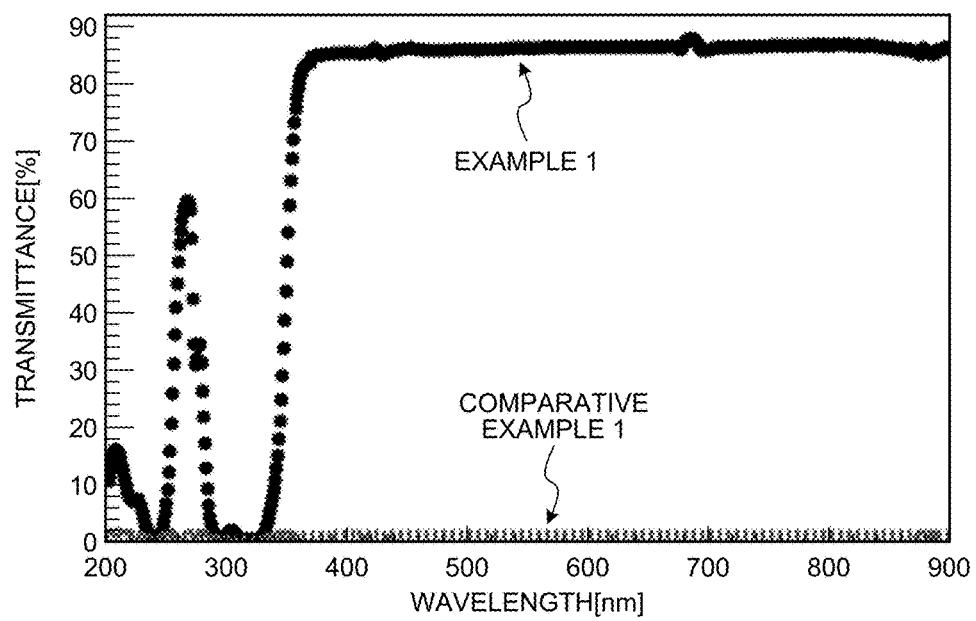
FIG. 7 is a diagram illustrating transmittance profiles of Example 1 and Comparative Example 1.

Next, the crystal of Example 1 was cut into a thickness of 1 mm and was mirror-polished, and the transmittance thereof in the 1 mm-thickness direction was measured. For light emission measurement, a UV-visible spectrophotometer (Model: V-530) manufactured by JASCO Corporation was used. Also for the crystals of Examples 2 to 6 and Comparative Examples 1 to 8, similar measurement was performed. FIG. 7 is a diagram illustrating transmission profiles obtained in Example 1 and Comparative Example 1. In FIG. 7, the horizontal axis is wavelength (nm), whereas the vertical axis is in-line transmittance (%). It had been revealed that the maximum wavelength range of light emission had been in about 360 to 430 nm through radioluminescence (5.5 MeV alpha-ray excitation) measurement using a spectroscope (Model: Instrument FLS920) manufactured by Edingurg; an in-line transmittance of 40% or more, which was a sufficient value, was shown in this light emission range. The crystals of Examples 2 to 6 also showed profiles of the same shape, whereas some of the crystals of Comparative Examples 1 to 8 showed an in-line transmittance of 10% or less (a thickness of 1 mm) in some cases, which may be difficult to be applied to gamma ray detection.

Furthermore, the light emission amount of the crystal obtained in Example 1 was estimated. The crystal was optically bonded to a photomultiplier tube (R7600U-200 manufactured by Hamamatsu Photonics K.K.) as a photodetector with optical grease (6262A manufactured by Ohyo Koken Kogyo K.K.) and was irradiated with gamma rays or alpha rays using a $^{137}$Cs sealed radiation source (gamma-ray source) having an activity of 1 MBq or a $^{241}$Am sealed radiation source (alpha-ray source) having an activity of 4 MBq to be excited to emit light.

A voltage of 700 V was applied to the photomultiplier tube to convert scintillation light into an electric signal. The electric signal output from the photomultiplier tube is a pulse-shaped signal reflecting the received scintillation light, in which the wave-height of the pulse indicates the light emission intensity of the scintillation light. The electric signal thus output from the photomultiplier tube was shaped and amplified by a shaping amplifier and was then input to a multiple wave-height analyzer to be analyzed, and wave-height distribution spectra were created. Also for the (Ce1%: GSO) crystal of Comparative Example 10, a wave-height distribution spectrum was similarly created. The temperature during measurement was room temperature (21° C.)

Figure 8:
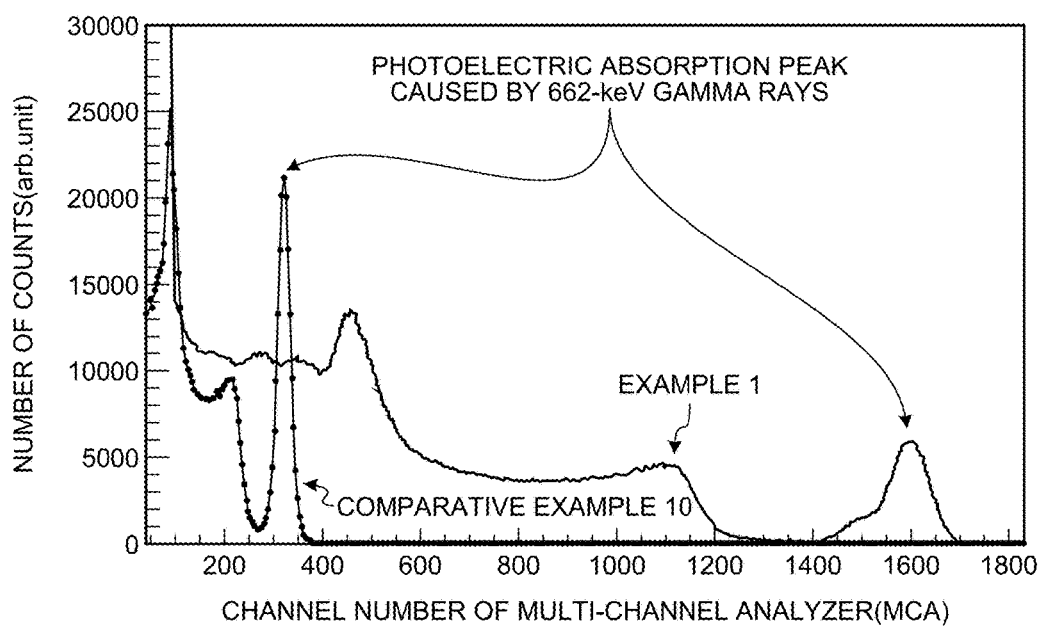
FIG. 8 is a diagram illustrating wave-height distribution spectra (Example 1 and Comparative Example 10) obtained by irradiating the crystals with $^{137}Cs$ gamma rays (662 keV).

FIG. 8 is a diagram illustrating wave-height distribution spectra (Example 1 and Comparative Example 10) obtained by irradiating the crystals with $^{137}$Cs gamma rays (662 keV). In FIG. 8, the horizontal axis is the channel number of a multi-channel analyzer (MCA), which indicates the magnitude of signals. The vertical axis is the number of counts (arbitrary unit). With respect to the horizontal axis, a photoelectric absorption peak caused by the 662-keV gamma rays being on the more right side of the drawing indicates a larger light emission amount. As can be seen from FIG. 8, the crystal of Example 1 showed a higher light emission amount than that of the crystal of Comparative Example 10. In FIG. 8, the light emission amount of the crystal of Example 1 was 36,000 photons/MeV or more.

Also for Examples 2 to 10, the light emission amounts were able to be determined as listed in Table 2. However, for Comparative Examples 1 to 8, the light emission amounts were unmeasurable.

TABLE 2

| Example No. | α | β | γ | Light emission amount [photons/MeV] |
|---|---|---|---|---|
| Example 1 | −0.05 | 0.01 | −0.06 | 43,000 |
| Example 2 | −0.003 | 0.05 | 0.10 | 40,000 |
| Example 3 | −0.01 | 0.03 | 0.05 | 37,000 |
| Example 4 | −0.05 | 0.00 | −0.08 | 34,000 |
| Example 5 | −0.02 | 0.06 | 0.09 | 35,000 |
| Example 6 | −0.05 | 0.04 | 0.01 | 33,000 |
| Example 7 | −0.04 | 0.05 | 0.04 | 41,000 |
| Example 8 | −0.04 | 0.05 | 0.04 | 40,000 |
| Example 9 | −0.04 | 0.04 | 0.02 | 35,000 |
| Example 10 | −0.01 | 0.03 | 0.05 | 38,000 |
| Comparative Example 1 | −0.34 | 0.48 | 0.02 | Unmeasurable |
| Comparative Example 2 | 0 | 0 | 0 | Unmeasurable |
| Comparative Example 3 | −0.34 | 0.48 | 0.02 | Unmeasurable |
| Comparative Example 4 | −0.34 | 0.48 | 0.02 | Unmeasurable |
| Comparative Example 5 | −0.34 | 0.48 | 0.02 | Unmeasurable |
| Comparative Example 6 | 0 | 0 | 0 | Unmeasurable |
| Comparative Example 7 | 0 | 0 | 0 | Unmeasurable |
| Comparative Example 8 | 0 | 0 | 0 | Unmeasurable |
| Comparative Example 9 | 0 | 0 | 0 | 30,000 |

Next, the decay time of the crystal of Example 1 was determined. The crystal was optically bonded to a photomultiplier tube (R7600U-200 manufactured by Hamamatsu Photonics K.K.) with optical grease (6262A manufactured by Ohyo Koken Kogyo Co., Ltd.) and was irradiated with gamma rays using a $^{137}$Cs sealed radiation source having an activity of 1 MBq to be excited to emit light. For signals from the photomultiplier tube, time distribution of the signals was measured by an oscilloscope (TDS 3034B manufactured by Tektronix, Inc.) to determine the decay time.

Figure 9:
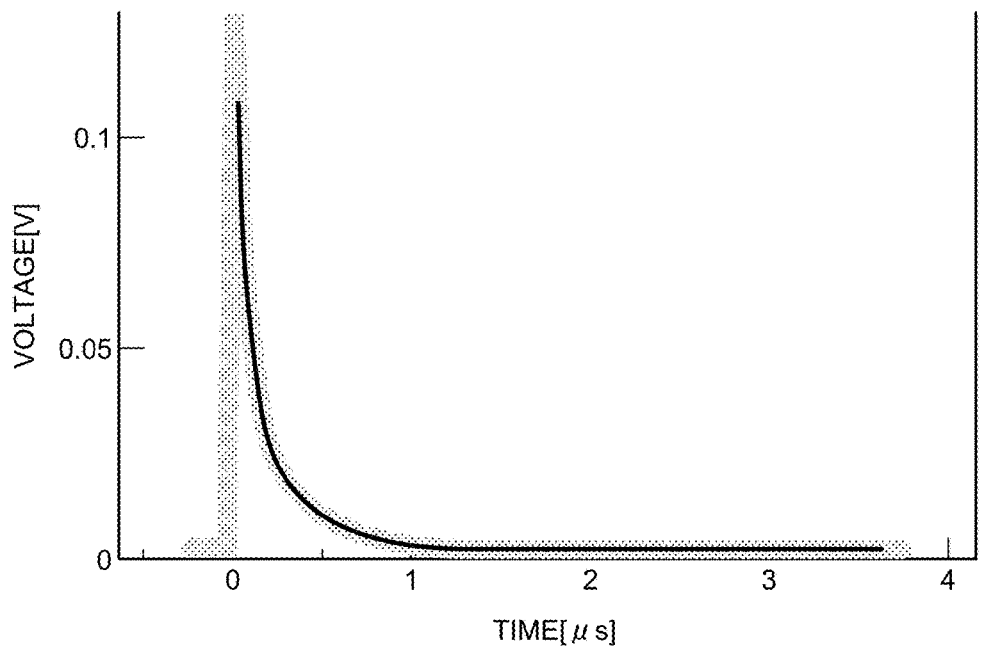
FIG. 9 is a diagram illustrating a profile of a fluorescence decay curve of a crystal of Example 1 obtained by irradiating the crystal with $^{137}Cs$ gamma rays (662 keV).

FIG. 9 is a diagram illustrating a profile of a fluorescence decay curve of the crystal of Example 1. In FIG. 9, the horizontal axis shows time, whereas the vertical axis shows voltage corresponding to light emission intensity. The solid line is a result obtained by fitting with the following function I(t) with time t as a variable in order to determine a decay constant, where $I(t) = 0.098 \cdot \exp(-t/71 \text{ ns}) + 0.040 \cdot \exp(-t/287 \text{ ns}) + 0.00241$ Specifically, the decay time of the fluorescence of the crystal of Example 1 was 71 ns, which was able to constitute a high-speed scintillator.

Next, the respective light emission amounts of the crystals of Examples 1 to 10 and Comparative Examples 19 and 20 under a high-temperature environment of 150° C. were measured. The crystals were optically bonded to a photomultiplier tube (R1288AH manufactured by Hamamatsu Photonics K.K.) as a photodetector with optical grease (6262A manufactured by Ohyo Koken Kogyo K.K.) and were irradiated with gamma rays using a $^{137}$Cs sealed radiation source (gamma-ray source) having an activity of 1 MBq or more to be excited to emit light. In this process, the crystals and the photomultiplier tube were heated at a high temperature of 150° C. using a thermostat oven (VTN-11 manufactured by Isuzu Seisakusho Co., Ltd.). In addition, whether the target temperature environment had been achieved was checked near the crystals with a thermocouple.

A voltage of −1,340 V was applied to the photomultiplier tube to convert scintillation light from the crystals into an electric signal. The electric signal output from the photomultiplier tube is a pulse-shaped signal reflecting the received scintillation light, in which the wave-height of the pulse indicates the light emission intensity of the scintillation light. The electric signal thus output from the photomultiplier tube was shaped and amplified by a shaping amplifier and was then input to a multiple wave-height analyzer to be analyzed, and wave-height distribution spectra were created. Also for the (Ce1%:GSO) crystal of Comparative Example 10, a wave-height distribution spectrum was similarly created.

For Examples 1 to 10, 19 and 20, the light emission amounts at 150° C. were able to be measured as listed in Table 3. When the light emission amounts were measured also in temperature conditions other than 150° C., Examples 1 to 10, 19 and 20 showed ones exceeding 13,000 photons/MeV in the range from room temperature to 150° C. However, for Comparative Examples 1 to 8, the light emission amounts were unmeasurable in the range from room temperature to 150° C.

TABLE 3

| Example No. | α | β | γ | Light emission amount at 150° C. [photons/MeV] |
|---|---|---|---|---|
| Example 1 | −0.05 | 0.01 | −0.06 | 32,000 or more |
| Example 2 | −0.003 | 0.05 | 0.10 | 32,000 or more |
| Example 3 | −0.01 | 0.03 | 0.05 | 30,000 or more |
| Example 4 | −0.05 | 0.00 | −0.08 | 30,000 or more |
| Example 5 | −0.02 | 0.06 | 0.09 | 30,000 or more |
| Example 6 | −0.05 | 0.04 | 0.01 | 30,000 or more |
| Example 7 | −0.04 | 0.05 | 0.04 | 30,000 or more |
| Example 8 | −0.04 | 0.05 | 0.04 | 28,000 or more |
| Example 9 | −0.04 | 0.04 | 0.02 | 27,000 or more |
| Example 10 | −0.01 | 0.03 | 0.05 | 30,000 or more |
| Example 19 | −0.02 | 0.05 | 0.07 | 32,000 or more |
| Example 20 | −0.02 | 0.00 | −0.03 | 30,000 or more |

Next, causing SPECT and PET to have positional resolution is important performance. Using the crystal of Example 1, a pixel array was formed (refer to FIG. 3). For a reflective member, a material selected from barium sulfate, Teflon (registered trademark), titanium oxide, and an ESR film can be used; this is not limiting.

Using the assembled array (Example 8), operation principle as SPECT and PET was demonstrated.

Specifically, the scintillator crystal of Example 1 was combined with a position-sensitive multi-pixel photon counter (MPPC, 512642-0808PA-50 manufactured by Hamamatsu Photonics K.K.). The MPPC includes a plurality of arranged Geiger mode avalanche photodiodes, and 6×6 MPPC units (pixel size: 50 μm×50 μm) are arrayed.

The array (Example 8) combined with the MPPC was irradiated with gamma rays using a $^{137}$Cs sealed radiation source having an activity of 1 MBq, and signals from the respective MPPCs were processed to perform imaging reconstruction.

Figure 10:
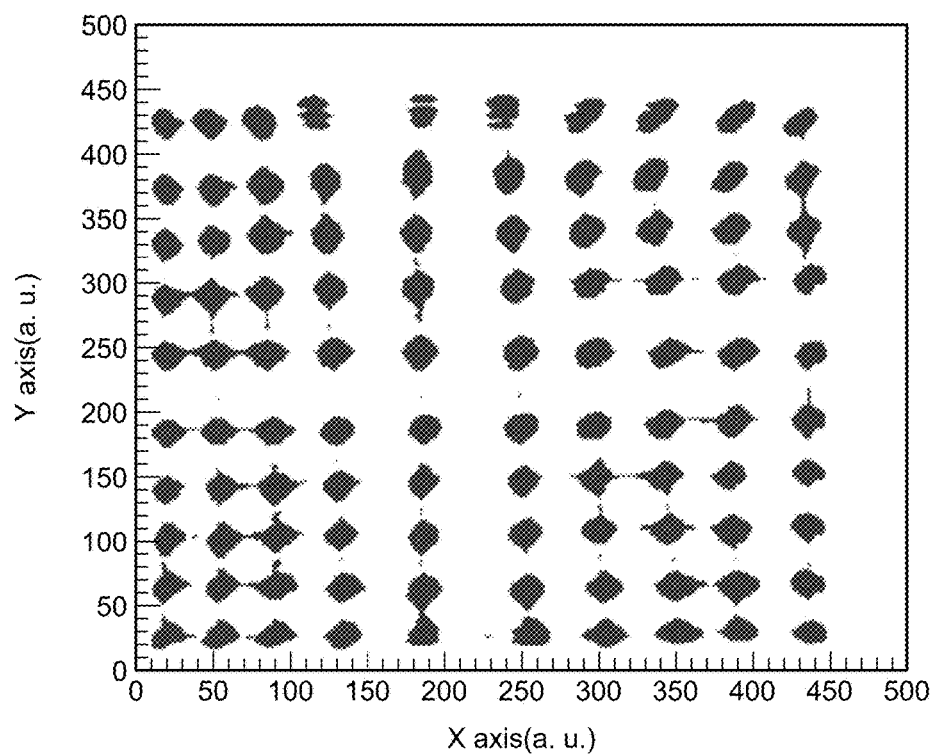
FIG. 10 is a diagram illustrating a reconstructed image obtained by irradiating a radiation detector with a pixel array and an MPPC combined with $^{137}Cs$ gamma rays (662 keV).

FIG. 10 is a diagram subjected to imaging reconstruction. The pixels were able to be separated from each other, and imaging was able to be correctly performed to demonstrate application to imaging detectors such as SPECT and PET caused to have positional sensitivity.

The present invention is not limited by the above-described embodiments. Any configuration obtained from appropriate combinations of the above-described components is also included in the present invention. Further effects and modifications can be easily derived by those skilled in the art. Wider embodiments of the present invention are therefore not limited to the above-described embodiments and can be changed in a variety of manners.

REFERENCE SIGNS LIST

100 Radiation detector
101 Crystal material
102, 104 Photodetector
103 Wavelength conversion element
200 Nondestructive inspection apparatus
201 Radiation source
202 Object under measurement
300 Imaging apparatus

The invention claimed is:

1. A crystal material that is represented by a general formula (1):

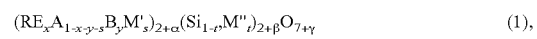

the crystal material having a pyrochlore type structure, being a nonstoichiometric composition, and being a congruent melting composition, wherein
in Formula (1), A contains at least one or more selected from Gd, Y, La, Sc, Yb, and Lu; B contains at least one or more selected from La, Gd, Yb, Lu, Y, and Sc; 0.1≤y<0.4; RE contains at least one or more selected from Ce, Pr, Nd, Eu, Tb, and Yb; 0<x<0.1; M' and M"

contain at least one or more selected from Li, Na, K, Mg, Ca, Sr, Ba, Ti, Zr, Hf, Fe, Ta, and W; $0 \leq s<0.01$ and $0 \leq t<0.01$; and $0<|\alpha|<0.3$ and $0 \leq |\beta|<0.3$ and $0 \leq |\gamma|<0.5$.

2. The crystal material according to claim 1, wherein ranges of x, y, s, t, $\alpha$, $\beta$, and $\gamma$ are further represented by $0<x<0.05$, $0.1<y<0.40$, $0 \leq s<0.005$, and $0 \leq t<0.005$, $0.001<|\alpha|<0.15$ and $0.001 \leq |\beta|<0.15$ and $0.001<|\gamma|<0.2$.

3. The crystal material according to claim 1, wherein ranges of x, y, s, t, $\alpha$, $\beta$, and $\gamma$ are further represented by $0<x<0.04$, $0.1<y<0.35$, $0 \leq s<0.005$, and $0 \leq t<0.005$, $0.01<|\alpha|<0.1$ and $0.01 \leq |\beta|<0.1$ and $0.001 \leq |\gamma|<0.2$.

4. The crystal material according to claim 1, wherein in the general formula (1), RE is Ce; A is Gd; and B is one or more selected from La and Y.

5. The crystal material according to claim 1, wherein the crystal material emits scintillation light through irradiation with radiation, with a certain fluorescent component contained in the scintillation light having a fluorescence lifetime of 2 μs or less and a peak fluorescence wavelength within a range of 250 nm or more and 900 nm or less.

6. The crystal material according to claim 1, wherein the crystal material emits scintillation light through irradiation with radiation, with a certain fluorescent component contained in the scintillation light having a fluorescence lifetime of 80 ns or less and a peak fluorescence wavelength within a range of 300 nm or more and 700 nm or less.

7. The crystal material according to claim 1, wherein the crystal material emits scintillation light through irradiation with radiation, with a light emission amount of a certain fluorescent component contained in the scintillation light exceeding 13,000 photons/MeV in an environmental temperature range from room temperature to 150° C. and the crystal material does not have deliquescence.

8. A method for manufacturing a crystal, the method comprising blending raw materials containing A, Si, and RE so as to provide an element ratio of the crystal material according to claim 1, increasing a temperature of the blended raw materials until the blended raw materials melt and then cooling the raw materials, and providing a crystal having a pyrochlore type structure and a crystallization rate of 50% or more.

9. A radiation detector comprising:
a scintillator formed of the crystal material according to claim 1; and
a photodetector that receives scintillation light from the scintillator.

10. An imaging apparatus comprising the radiation detector according to claim 9.

11. A nondestructive inspection apparatus comprising the radiation detector according to claim 9.

12. A radiation detector comprising:
a scintillator formed of the crystal material according to claim 1;
a wavelength conversion element that receives scintillation light from the scintillator and converts a wavelength of light with wavelengths from 260 nm to 350 nm contained in the scintillation light into any wavelength in a range from 320 nm to 700 nm; and
a photodetector that receives light wavelength-converted by the wavelength conversion element.

13. An imaging apparatus comprising the radiation detector according to claim 12.

14. A nondestructive inspection apparatus comprising the radiation detector according to claim 12.

15. A radiation detector comprising the scintillator formed of the crystal material according to claim 1 having positional sensitivity.

16. An imaging apparatus comprising the radiation detector according to claim 15.

17. A nondestructive inspection apparatus comprising the radiation detector according to claim 15.

* * * * *